(12) United States Patent
Fiedler et al.

(10) Patent No.: US 7,791,265 B2
(45) Date of Patent: Sep. 7, 2010

(54) RED-EMITTING LUMINESCENT SUBSTANCE AND LIGHT SOURCE COMPRISING SUCH A LUMINESCENT SUBSTANCE

(75) Inventors: Tim Fiedler, Munich (DE); Wolfram Hempel, Leutenbach (DE); Frank Jermann, Koenigsbrunn (DE)

(73) Assignee: Osram Gesellschaft mit beschraenkter Haftung, Munich (DE)

( * ) Notice: Subject to any disclaimer, the term of this patent is extended or adjusted under 35 U.S.C. 154(b) by 0 days.

(21) Appl. No.: 12/086,396

(22) PCT Filed: Nov. 29, 2006

(86) PCT No.: PCT/EP2006/069067

§ 371 (c)(1),
(2), (4) Date: Apr. 30, 2009

(87) PCT Pub. No.: WO2007/068592

PCT Pub. Date: Jun. 21, 2007

(65) Prior Publication Data

US 2009/0212683 A1      Aug. 27, 2009

(30) Foreign Application Priority Data

Dec. 13, 2005    (DE) .................. 10 2005 059 521

(51) Int. Cl.
   *H05B 33/00*    (2006.01)
(52) U.S. Cl. .................. 313/501; 252/301.4 R
(58) Field of Classification Search ............ 313/501; 252/301.4 R
   See application file for complete search history.

(56) References Cited

U.S. PATENT DOCUMENTS

| | | | |
|---|---|---|---|
| 4,810,938 | A | 3/1989 | Johnson et al. |
| 6,682,663 | B2 | 1/2004 | Botty et al. |
| 6,717,353 | B1 | 4/2004 | Mueller et al. |
| 2002/0137709 | A1 | 9/2002 | Lin et al. |
| 2003/0094893 | A1* | 5/2003 | Ellens et al. ........... 313/503 |
| 2005/0035704 | A1 | 2/2005 | Kosyachkov |

FOREIGN PATENT DOCUMENTS

| | | |
|---|---|---|
| EP | 1 150 361 A1 | 10/2001 |
| EP | 1 560 274 A1 | 8/2005 |
| WO | 01/40403 A1 | 6/2001 |
| WO | 01/50540 A1 | 7/2001 |
| WO | 02/103748 A1 | 12/2002 |
| WO | 2005/030904 A1 | 4/2005 |
| WO | 2005/031797 A2 | 4/2005 |

OTHER PUBLICATIONS

Pugar et al., "New Cubic Structure in the Ca-Si-O-N System," J. Am. Ceram. Soc., vol. 71, No. 6, pp. C-288-C-291 (Jun. 1988).

* cited by examiner

*Primary Examiner*—Toan Ton
*Assistant Examiner*—Hana S Featherly

(57) ABSTRACT

Disclosed is a luminescent substance which has the structure $EA_3N_2Si_2O_4$:D, wherein EA=(Sr,Ba,Ca) and D=Eu, provides red emission, and is characterized by great stability and a simple production process. Said luminescent substance can be used for many different types of light sources.

12 Claims, 2 Drawing Sheets

RED-EMITTING LUMINESCENT SUBSTANCE AND LIGHT SOURCE COMPRISING SUCH A LUMINESCENT SUBSTANCE

TECHNICAL FIELD

The invention is based on a red-emitting luminescent substance and additionally relates to a light source, in particular an LED, comprising such a luminescent substance. The luminescent substance belongs to the class of the oxynitridosilicates.

PRIOR ART

Hitherto, there have been few technically viable luminescent substances from the class of the oxynitridosilicates which emit in the red and which can be excited in the spectral range UV, blue to green. However, they are complicated to produce. One example is the nitridosilicate $Ca_2Si_5N_8$:Eu described in EP-A-1 153 101, which emits in the orange-red. That luminescent substance, in conjunction with high-efficiency green or yellow luminescent substances such as (Sr, Ca)$Si_2O_2N_2$:Eu and $Y_3(Al,Ga)_5O_{12}$:Ce, makes it possible to construct long-lived warm-white LEDs having a color rendering index Ra of less than 80.

Another example is the (Sr,Ca,Ba)S:Eu known from EP 1 150 361, for example, which has low stability.

Better color rendering requires stable deep-red or red luminescent substances, which, however, could only be produced in a complicated and expensive manner on the basis of the luminescent substances mentioned above.

SUMMARY OF THE INVENTION

It is an object of the present invention to provide a luminescent substance which emits in the red, which can be excited in particular in the emission range of typical UV and blue-green LEDs, is stable and is simple to produce.

This object is achieved by means of the characterizing features of claim 1. Particularly advantageous configurations are found in the dependent claims.

A further object is to provide a light source, in particular an LED, comprising such a luminescent substance.

This object is achieved by means of the characterizing features of claim 10. Particularly advantageous configurations are found in the dependent claims.

Specifically, a red-emitting luminescent substance from the class of the oxynitridosilicates, which substantially has the structure $EA_3Si_2O_4N_2$:D, is involved, wherein the luminescent substance has as component EA=Sr, Ba and/or Ca alone or in combination, wherein the activating doping D, which replaces part of EA, consists of Eu.

Preference is given to a luminescent substance in which in the representation of $EA_3Si_2O_4N_2$:D as $(Sr_{1-x-y-z}Ba_yCa_xEu_z)_3Si_2O_4N_2$, the proportion of Eu is between z=0.01 and 0.10.

In particular, EA=Sr alone or EA=Ca alone.

The invention additionally relates to a light source having a primary radiation source, which emits radiation in the short-wave range of the optical spectral range in the wavelength range from 250 to 480 nm, wherein this radiation is wholly or partly converted into secondary radiation with a longer wavelength in the visible spectral range by means of a first luminescent substance as represented above.

In this case, in particular, the primary radiation source used is a light-emitting diode based on InGaN or InGaAlP or a discharge lamp based on low pressure or high pressure, in particular with an indium-containing fill, or an electroluminescent lamp.

In a preferred exemplary embodiment, part of the primary radiation is furthermore converted into radiation with a longer wavelength by means of further luminescent substances, wherein the luminescent substances are in particular selected and mixed appropriately so as to generate white light. In this case, the luminescent substances can be chosen, in particular, such that the light source has a color temperature of at least 2000 K, in particular 2700 to 3500 K.

In the case of such a light source, a high efficiency can be achieved by virtue of the fact that the emission of the chip has a peak wavelength in the range from 445 to 475 nm, in particular 450 to 455 nm.

The emission of the oxynitridosilicate often lies in the range from 595 to 650 nm, in particular 600 to 630 nm, as peak wavelength.

It is thus possible to specify a light source in which an Ra of at least 88 is obtained, in particular more than 90.

The invention also specifies a process for producing a high-efficiency luminescent substance as described above, comprising the following process steps:
a) providing the starting materials $SiO_2$ and/or $Si_3N_4$, $SrCo_3$, $BaCO_3$, $CaCO_3$ and an Eu precursor, in particular $Eu_2O_3$, in a substantially stoichiometric ratio;
b) mixing the starting materials and annealing using a flux;
c) wherein the annealing of the mixture is carried out at approximately 1300 to 1700° C., preferably 1500 to 1600° C.

The luminescent substances according to the invention can also be used in connection with other UV or blue light sources such as molecular emitters (e.g. in discharge lamp), blue OLEDs or in combination with blue EL luminescent substances. EL stands for electroluminescent.

The luminescent substance according to the invention makes it possible to produce color-stable, efficient LEDs or LED modules based on a conversion LED. Further areas of application are in white LEDs with good color rendering, color-on-demand LEDs or white OLEDs.

The newly synthesized luminescent substance belongs to the class of the oxynitrides or more precisely of the oxynitridosilicates and has the stoichiometry $Ea_3Si_2O_4N_2$:Eu. It emits with a high efficiency in the red. In this case, EA is at least one from the group of the alkaline earth metals Sr,Ba,Ca. In the case of excitation at 460 nm, the dominant wavelength is 601 nm. In this case, the Eu doping is 2%. It can be shifted to an even longer wavelength by increasing the Eu content. Conversely, the emission shifts toward shorter wavelengths if the Eu content is low. The full width at half maximum is approximately 100 nm FWHM.

The luminescent substance can be excited well in the range of 250-500 nm.

In the case of EA=Ca, for example, the luminescent substance according to the invention can be produced from 4.5 parts of CaO, wherein this material is partially substituted by $Eu_2O_3$ in accordance with the doping, and one part of $Si_3N_4$. Alternatively, production takes the route of three parts of CaO and one part of SiO2. The starting substances are mixed and annealed at high temperatures in forming gas (first synthesis: for example at 1500 to 1600° C., forming gas).

The fundamental structure of the luminescent substance is crucial to the excellent properties, without exact compliance with the stoichiometry being important. The luminescent substance is very radiation-stable, allowing it to be used in high-brightness LEDs.

The Ca can in particular be partly substituted by Ba or Sr, such that other wavelengths can also be achieved. A replacement of up to 40% is preferred.

In particular, this luminescent substance can be efficiently excited by a blue-emitting LED, primarily of the type InGaN. It is also suitable for application in other light sources, and in particular for application together with other luminescent substances in order to generate white light with a very high Ra.

Efficient, in particular including warm-white LEDs with a color rendering index Ra of up to 97 can be provided using a plurality of, in particular 2 to 3, luminescent substances, the typical quantum efficiency of which is well over 70%, and which absorb very well in the range of short-wave UV or partly in the range of blue radiation, primarily including at 450 to 455 nm, where the strongest chips are available. A typical Ra value is 88 to 95, depending on the desired optimization. In this case, in addition to the novel red oxynitridosilicate, a green-yellow luminescent substance is added, for example YAG:Ce, $(Lu,Y)_3(Al,Ga)_5O_{12}$:Ce, $SrSi_2O_2N_2$:Eu or else $(Sr,Ba,Ca)_2SiO_4$:Eu. These emit in the yellow-green range with a peak emission at 530 to 570 nm.

Specifically, an LED is furthermore proposed which is embodied as a red-emitting luminescence conversion LED, having a primary radiation source which is a chip that emits in the blue or UV spectral range, and disposed in front of it a layer of a luminescent substance which partly or completely converts the radiation of the chip, wherein the luminescent substance originates from the class of the oxynitridosilicates described above, with a doping of europium.

The oxynitridosilicate has the general formula $(Sr_{1-x-y-z}Ca_xBa_yEu_z)_2Si_2O_4N_2$, in particular where $x \geq 0.3$, $y \leq 0.2$, z is preferably $\leq 0.1$, in particular where z=0.01 to 0.05 holds true.

A suitable light source is in particular an LED. The emission from the chip is preferably such that it has a peak wavelength in the range from 445 to 465 nm, in particular 450 to 455 nm. The highest efficiencies of the primary radiation can be obtained in this way.

A further application area is a color emitting LED (color-on-demand), the emission of which is in the red to deep-red range of the spectrum.

Standard processes can be used for use in the LED. In particular, the following implementation options result:

Firstly, dispersing the luminescent substance in the LED potting compound, for example a silicone or epoxy resin, followed by application by, for example, casting, printing, spreading or the like.

Secondly, the introduction of the luminescent material into a so-called molding compound and a subsequent transfer-molding process.

Thirdly, methods of near-chip conversion, that is to say application of the luminescent substances or a mixture at the wafer processing level, after the chips have been singulated and after mounting in the LED housing. In this respect, reference is made in particular to DE-A-101 53 615 and WO-A 01/50540.

The invention furthermore relates to an illumination system comprising LEDs, wherein the illumination system furthermore contains electronic components. The latter mediate the dimmability, for example. A further task of the electronics is to drive individual LEDs or else groups of LEDs. These functions can be realized by previously known electronic elements.

The prior art does not comprise a high-efficiency red- to deep-red-emitting luminescent substance which can be produced so simply and which at the same time is insensitive to external influences and, moreover, can be excited well by primary light sources that emit in the blue or UV. Such light sources are in particular UV- or blue-emitting LEDs of the type InGaN or else InGaAlP, moreover discharge lamps which use luminescent substances, as known per se, in particular high-pressure discharge lamps, which have a high color rendering index Ra, or which are based on indium lamps which can be operated either with high pressure or low pressure. On account of its extraordinary radiation stability, however, the novel luminescent substance is additionally suitable for discharge lamps, in particular for indium discharge lamps, and in particular as a stable luminescent substance for discharge lamps having a high Ra, for example above Ra=90.

Luminescent substances from the class $(Sr,Ca,Ba)_3Si_2O_4N_2$:Eu emit in the red spectral range in a manner similar to nitridosilicates. However, in contrast to the latter, they can be produced from $EACO_3$ and also $SiO_2$ and $Si_3N_4$. These substances have a relatively low sensitivity to oxygen and moisture and can therefore be processed even without a protective gas atmosphere. Moreover, the carbonates as a source for the alkaline earth metal ions are significantly less expensive than the pure metals or nitrides. Therefore, the luminescent substances according to the invention can be produced very cost-effectively.

It is moreover astonishing that the novel luminescent substances emit in the red. In general, the wavelength of the emission becomes shorter and shorter if the compound increasingly contains oxygen. Thus, the oxygen-free nitridosilicate $Sr_2Si_5N_8$:Eu with a ratio of N:O=8:0 emits in the red and the oxygen-containing $SrSi_2O_2N_2$:Eu with N:O=2:2 emits in the green. The novel compound $Sr_3Si_2O_4N_2$:Eu with N:O=2:4 could therefore be expected to emit in the blue to blue-green rather than in the red. One reason is presumably that the activator sites here, despite the significant excess of oxygen, are nevertheless predominantly surrounded by $N^{3-}$ ions.

FIGURES

The invention will be explained in more detail below on the basis of a plurality of exemplary embodiments. In the figures:

FIG. 1 shows the emission spectrum of a luminescent substance according to the invention;

FIG. 2 shows the reflection spectrum of said luminescent substance;

FIG. 3 shows the construction of a conversion LED;

FIG. 4 shows a low-pressure lamp with indium fill using an orthosilicate.

DESCRIPTION OF THE DRAWINGS

One specific example of the luminescent substance according to the invention is shown in FIG. 1. It shows the emission of the luminescent substance $Sr_3Si_2O_4N_2$:Eu having an Eu proportion of 2 mol % of the lattice sites occupied by Sr. The emission maximum of the pure luminescent substance (peak) is 620 nm. The excitation was effected at 460 nm. The FWHM is 99 nm. The dominant wavelength is 601 nm. The quantum efficiency is a good 80%. An alternative representation of this luminescent substance is $Sr_{2.94}Eu_{0.06}SiO_4N_2$.

Figure 1:
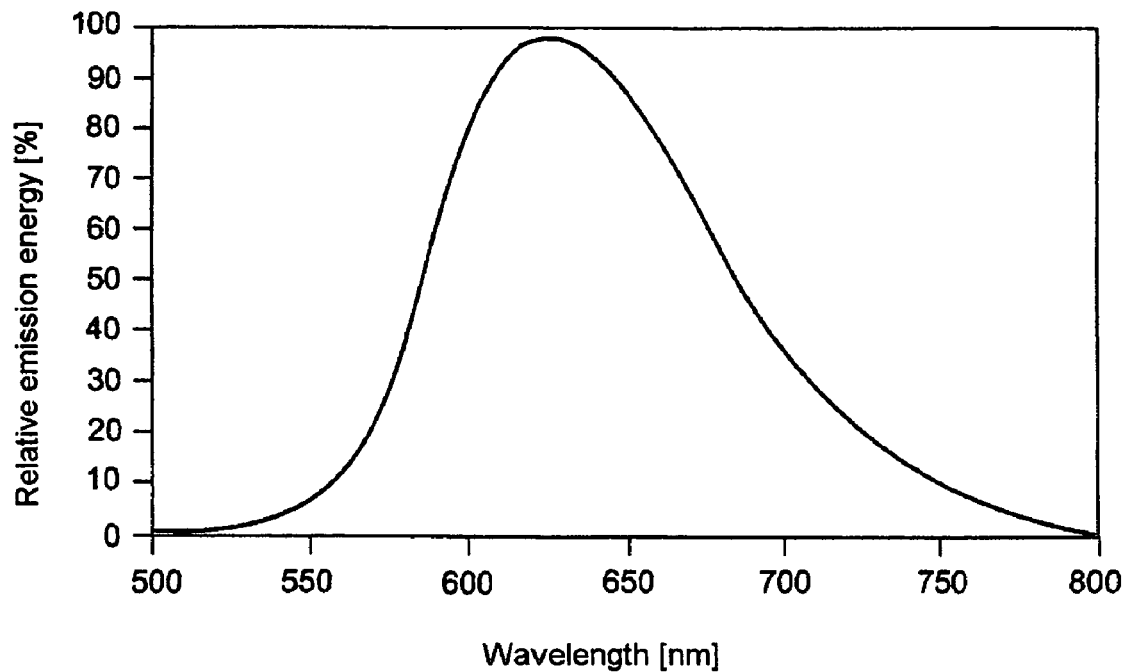
Figure 2:
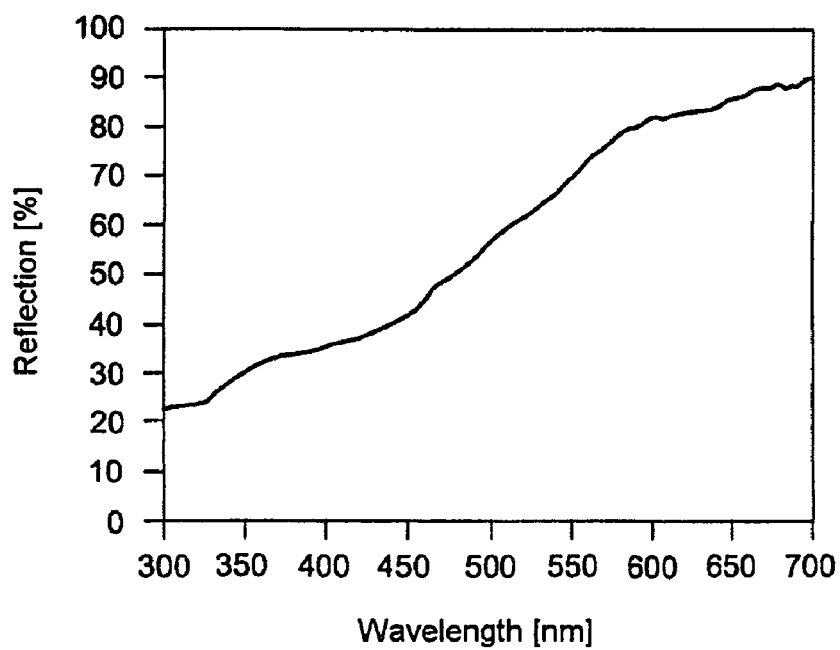
FIG. 2 shows the reflection spectrum of this luminescent substance.
Figure 3:
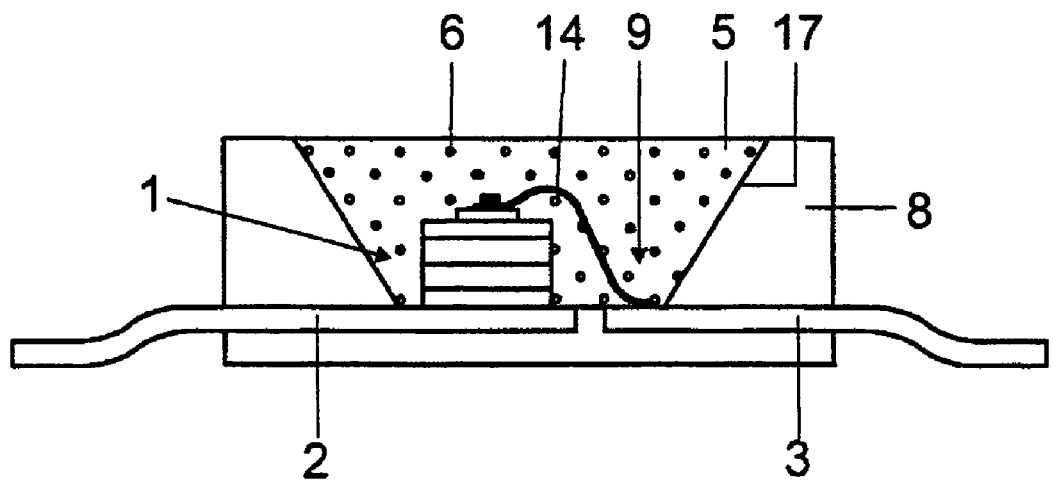

The construction of a light source for red light is shown explicitly in FIG. 3. The light source is a semiconductor component with a chip 1 of the type InGaN with a peak emission wavelength from 440 to 470 nm, for example 460 nm, which is embedded into a light-opaque basic housing 8 in the region of a cutout 9. The chip 1 is connected via a bonding wire 14 to a first terminal 3 and directly to a second electrical terminal 2. The cutout 9 is filled with a potting compound 5, which as its main constituents contains an epoxy casting resin (80 to 90% by weight) and luminescent substance pigments 6 of a luminescent substance (less than 20% by weight). The luminescent substance is the Sr oxynitridosilicate with 2% Eu presented as the first exemplary embodiment. The cutout 9 has a wall 17 serving as a reflector for the primary and secondary radiation from the chip 1 and the pigments 6. The dominant wavelength at 581 nm precisely satisfies the specification for the amber in traffic-light systems.

The efficiency and the color rendering index Ra are generally adapted by the level of doping with Eu; a value for Eu of 1 to 5 mol % of the A is preferred.

Another example is Ca3N2Si2O4:Eu, which exhibits similar properties to Sr3N2Si2O4:Eu.

In the case of a white LED with three luminescent substances, SrSi2O2N2:Eu is used besides the Sr oxynitridosilicate as a green-emitting luminescent substance. The combination of the blue primary and red, and yellow-green secondary radiation mixes to form warm-white having a high Ra of 88 to 97. Two luminescent substances are sufficient here, in contrast to the prior art, which required three luminescent substances for this purpose.

Figure 4:
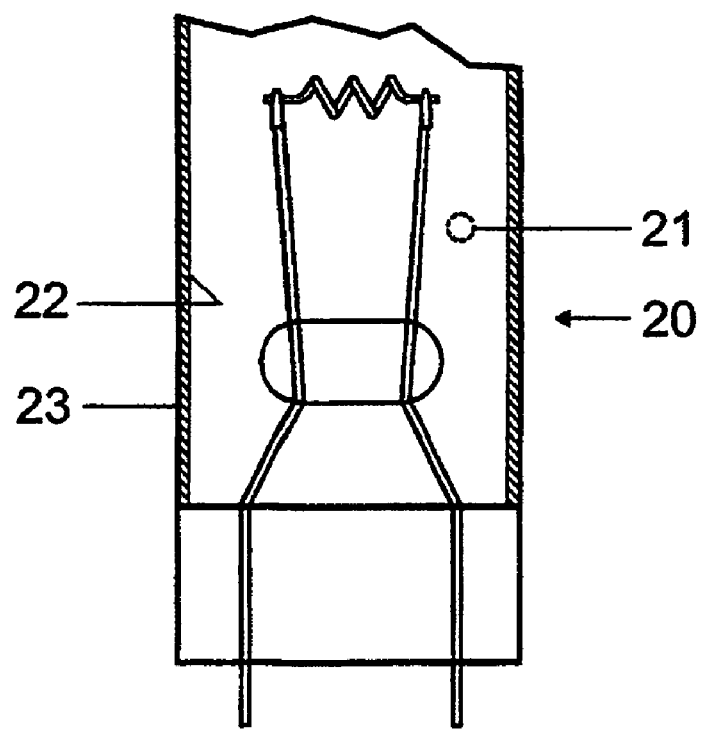

FIG. 4 shows a low-pressure discharge lamp 20 with a mercury-free gas fill 21 (illustrated schematically), which contains an indium compound and a buffer gas analogously to WO 02/10374, with a layer 22 composed of oxynitridosilicate Sr3N2Si2O4:Eu being applied to the inside of the bulb 23. The very particular advantage of this arrangement is that said orthosilicate is ideally matched to the indium radiation, since the latter has significant components both in the UV and in the blue spectral range, which are both equally well absorbed by said orthosilicate, which makes it superior for this use to the luminescent substances that have been disclosed hitherto. These known luminescent substances significantly absorb either only the UV radiation or the blue radiation of the indium, with the result that the indium lamp according to the invention exhibits a significantly higher efficiency. This statement also applies to an indium lamp based on high pressure as is known per se from U.S. Pat. No. 4,810,938.

The invention claimed is:

1. A red-emitting luminescent substance from the class of the oxynitridosilicates, which substantially has the structure EA3Si2O4N2:D, wherein the luminescent substance has as component EA=Sr, Ba and/or Ca alone or in combination, wherein the activating doping D, which replaces part of EA, consists of Eu.

2. The luminescent substance as claimed in claim 1, wherein in the representation of EA3Si2O4N2:D as (Sr1-x-y-zBayCaxEuz)3Si2O4N2, the proportion of Eu is between z=0.01 and 0.10.

3. The luminescent substance as claimed in claim 1, wherein EA=Sr alone.

4. The luminescent substance as claimed in claim 1, wherein EA=Ca alone.

5. A light source having a primary radiation source, which emits radiation in the short-wave range of the optical spectral range in the wavelength range form 250 to 480 nm, wherein this radiation is wholly or partly converted into secondary radiation with a longer wavelength in the visible spectral range by means of a first luminescent substance as claimed in claim 1.

6. The light source as claimed in claim 5, wherein the primary radiation source used is a light-emitting diode based on InGaN or InGaAlP or discharge lamp based on low pressure or high pressure, in particular with an indium-containing fill, or an electroluminescent lamp.

7. The light source as claimed in claim 5, wherein part of the primary radiation is furthermore converted into radiation with a longer wavelength by means of further luminescent substances, wherein the luminescent substances are in particular selected and mixed appropriately so as to generate white light.

8. The light source as claimed in claim 7, wherein the light source has a color temperature of at least 2000 K, in particular 2700 to 3500 K.

9. The light source as claimed in claim 5, wherein the emission of the chip has a peak wavelength in the range from 445 to 475 nm, in particular 450 to 455 nm.

10. The light source as claimed in claim 5, wherein the emission of the oxynitridosilicate has a peak wavelength in the range from 595 to 650 nm, in particular 600 to 630 nm.

11. The light source as claimed in claim 5, wherein an Ra of at least 88 is obtained, in particular more than 90.

12. A process for producing a high-efficiency luminescent substance as claimed in claim 1, characterized by the following process steps:
   a) providing the starting materials $SiO_2$ and/or $Si_3N_4$, $SrCO_3$, BaCO3, $CaCO_3$ and an Eu precursor, in particular Eu2O3, in a substantially stoichiometric ratio;
   b) mixing the starting materials and annealing using a flux;
   c) wherein the annealing of the mixture is carried out at approximately 1300 to 1700° C., preferably 1500 to 1600°.

\* \* \* \* \*